United States Patent [19]

Walker

[11] Patent Number: 5,395,778
[45] Date of Patent: Mar. 7, 1995

[54] METHOD OF MANUFACTURING AN INTEGRATED CIRCUIT HAVING A MEMORY ELEMENT

[75] Inventor: Andrew J. Walker, Eindhoven, Netherlands

[73] Assignee: U.S. Philips Corporation, New York, N.Y.

[21] Appl. No.: 132,722

[22] Filed: Oct. 6, 1993

[30] Foreign Application Priority Data

Oct. 7, 1992 [EP] European Pat. Off. ............ 92203082

[51] Int. Cl.[6] ......................................... H01L 21/266
[52] U.S. Cl. .................... 437/43; 437/44; 437/57; 437/983
[58] Field of Search ............ 437/43, 44, 56, 57, 437/58, 968, 983

[56] References Cited

U.S. PATENT DOCUMENTS

| | | | |
|---|---|---|---|
| 4,598,460 | 7/1986 | Owens et al. | 437/57 |
| 4,719,184 | 1/1988 | Cantarelli et al. | 437/52 |
| 4,766,088 | 8/1988 | Kono et al. | 437/43 |
| 4,775,642 | 10/1988 | Chang et al. | 437/57 |
| 4,859,619 | 8/1989 | Wu et al. | 437/43 |
| 5,036,018 | 7/1991 | Mazzali | 437/43 |

*Primary Examiner*—Brian E. Hearn
*Assistant Examiner*—Chandra Chaudhari
*Attorney, Agent, or Firm*—Steven R. Biren

[57] ABSTRACT

If the process were to be changed for optimizing the injection of hot electrons into the channel of the memory transistor in the manufacture of an integrated circuit having an embedded EPROM, this could lead to degradation of the transistors in the logic, in particular in the case of channel lengths below 1 $\mu$m. To prevent this, a process is presented by which the non-volatile memory is optimized without the properties of the logic being affected. For this purpose, a first series of steps is performed in which first the floating gate is defined, followed by the source/drain implantation and a side-wall oxidation for obtaining an oxide spacer on the sides of the floating gate. During these steps, the region of the logic to be formed is uniformly protected against implantation and oxidation by the same poly layer from which the floating gate is made. Then, in a second series of steps, the usual CMOS process is carried out whereby first the gates of the transistors are formed, followed by the necessary source/drain implantations.

12 Claims, 7 Drawing Sheets

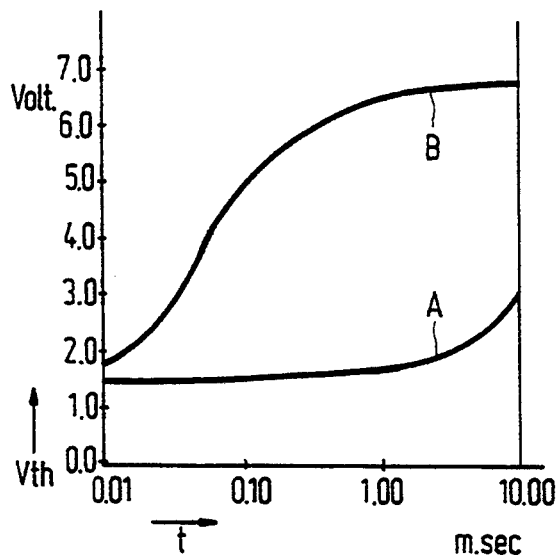
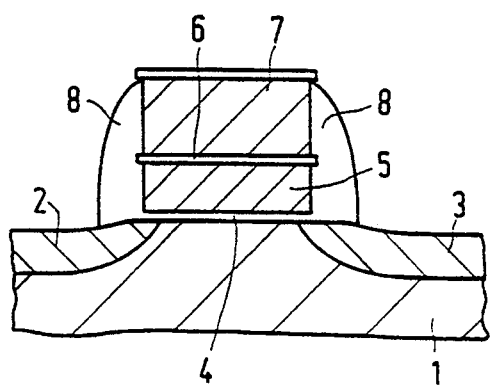
FIG.1a   FIG.1b
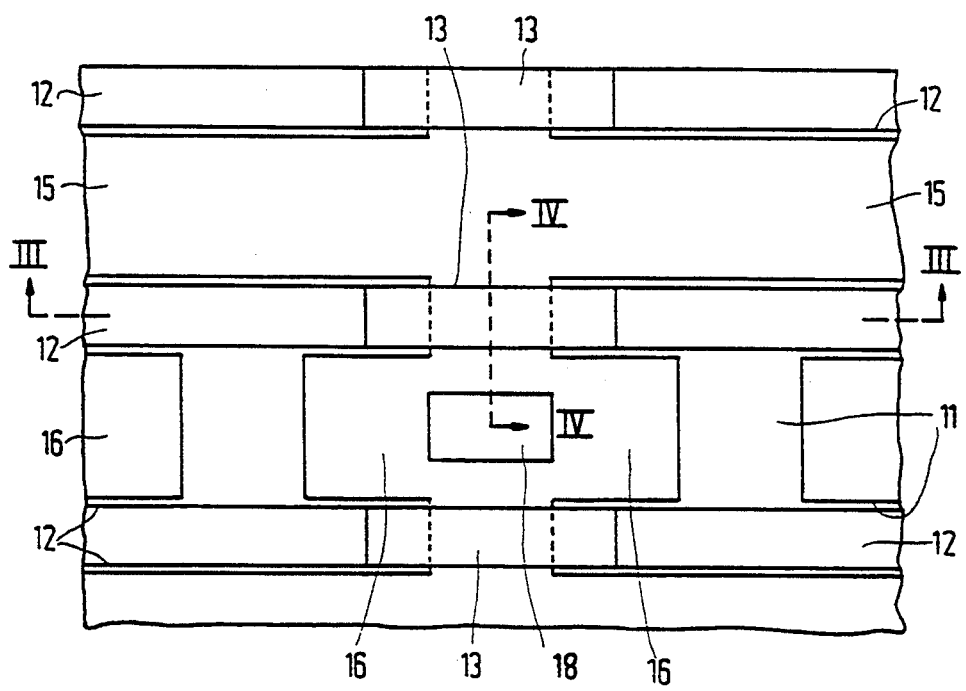
FIG.2

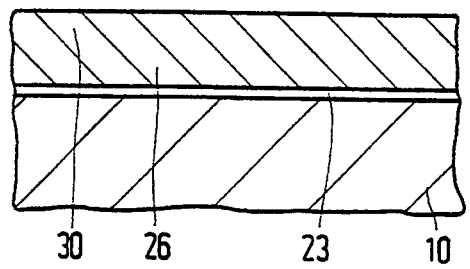
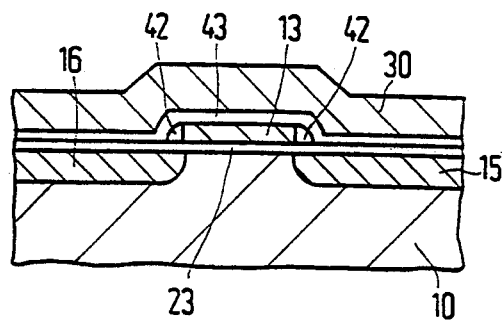
FIG. 18a
FIG. 18b
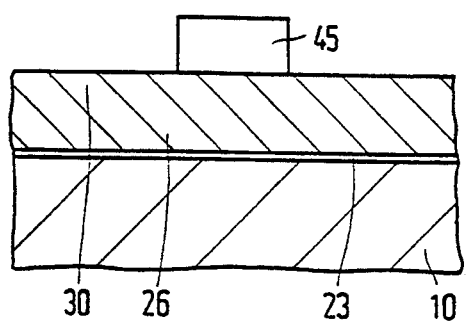
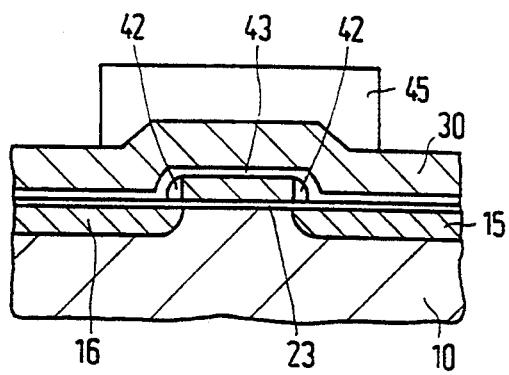
FIG. 19a
FIG. 19b
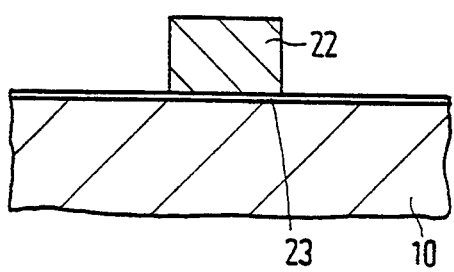
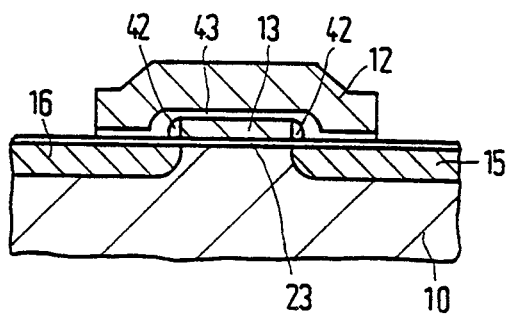
FIG. 20a
FIG. 20b

METHOD OF MANUFACTURING AN INTEGRATED CIRCUIT HAVING A MEMORY ELEMENT

FIELD OF THE INVENTION

The invention relates to a method of manufacturing an integrated circuit comprising a semiconductor body which is provided at a surface with a field effect transistor with insulated gate electrode and with a non-volatile memory element with a floating gate situated between a control electrode and a channel region which is situated in the semiconductor body and extends in the semiconductor body between a source and a drain zone, by which method a first and a second active region of a first conductivity type adjoining the surface are defined in the semiconductor body for the transistor and for the memory element, respectively, and the surface is coated with an insulating layer forming a gate dielectric at least at the area of the first and the second active region, on which insulating layer a silicon layer is provided from which the gate electrode of the transistor and at least the floating gate of the memory element are formed. The invention also relates to an integrated circuit manufactured by such a method.

BACKGROUND OF THE INVENTION

The ever-increasing miniaturization in integrated circuits has rendered it possible to integrate entire systems in a single silicon crystal. It has now become desirable in this development to combine memories with the logic usual in, for example, CMOS technology. These memories are often called "embedded memories" in the literature. A type of memory which is of particular importance in this connection is the non-volatile memory or EPROM (Electrically Programmable Read Only Memory). The memory element is formed by a transistor with a floating gate whose threshold voltage is determined by the written information in the form of electric charge on the floating gate electrode. The control gate on the one hand serves to detect what the threshold voltage, and thus the written information is during reading and on the other hand to influence the potential of the floating gate during writing and/or erasing.

A method of the kind mentioned in the opening paragraph is known inter alia from US Pat. No. 4,719,184. In this known process, the non-volatile memory element is manufactured with two layers of polycrystalline silicon (called poly hereinafter for short) mutually separated by a dielectric, for example an oxide, the floating gate being formed from the lower poly layer and the control gate from the upper poly layer. The normal transistors of the logic gates are manufactured from the same poly layers, obviously without the inter-poly dielectric, and in the same process steps as the memory elements. It is generally desirable for non-volatile memories that writing and/or erasing can take place at a reasonable speed and at comparatively low voltages (for example, below 15 V) which can be readily generated in the circuit itself. If this means that certain process conditions are to be fulfilled, it is usual to adapt the process for the normal CMOS logic to this in order to keep the process as simple as possible. This may lead to problems. Especially with channel lengths below 1 $\mu$m, the use of an optimized process for the memory may thus easily lead to degradation in the logic transistors because the injection of charge carriers into the gate dielectric will shift the threshold voltage in the course of time. Summarizing, the optimization of the "embedded" EPROM is difficult to realise when the dimensions in the logic become small, in particular in the case of channel lengths below 1 $\mu$m.

SUMMARY OF THE INVENTION

The invention has for its object inter alia to provide a method for the manufacture of an embedded non-volatile memory whereby an optimization of the memory is obtained through the use of a usual logic process with a minimum number of additional process steps without the quality of the logic portion of the circuit being reduced.

According to the invention, a method of the kind mentioned in the opening paragraph is characterized in that in a first series of process steps first the floating gate of the memory element is formed from the silicon layer by masked etching while the active region of the transistor remains covered by the silicon layer, after which the source and drain zones of the second conductivity type of the memory element are provided and the floating gate is provided with an oxide layer at least at its edges by means of an oxidation step, which oxide layer will be called spacer hereinafter, and in that in a subsequent series of steps the insulated gate electrode of the transistor is formed from the silicon layer above the other active region by masked etching, and source and drain zones of the second conductivity type of the transistor are provided in the semiconductor body by means of doping.

The invention is based inter alia on the recognition that the manner in which the sides of the floating gate are covered with an insulating layer have a major influence on the non-volatile memory. This layer determines, for example, the speed with which charges leaks away from the floating gate, and thus determines the retention time of the memory which should obviously be as long as possible. The spacer on the floating gate, however, is also found to have a strong influence on the hot-electron effects which render it possible to program the memory sufficiently quickly at low voltages. Experiments have shown in this connection that much better programming speed results are obtained with an oxidation temperature of 900° C. than with an oxidation temperature of 800° C. Since the spacer oxidation for the EPROM portion of the circuit is not carried out in the logic portion in the method according to the invention, it is possible to optimize the process as regards hot charge carrier effects in the memory without these effects being reinforced in the remaining portion of the circuit. As will become evident from the description of the Figures, the number of additional process steps for this optimization is very small, requiring as it does no more than 2 or 3 extra masks.

Although advantages can be obtained also at channel lengths, i.e. distances between source and drain, slightly greater than 1 $\mu$m, the invention is of particular importance when the transistor is provided with a channel having a length of at most approximately 1 $\mu$m. A transistor with such a small channel length has the advantage that a high packing density in the circuit can be obtained, but on the other hand is very sensitive to degradation owing to small-channel effects which are caused inter alia by hot charge carriers in the channel. A preferred embodiment in which these small-channel effects are at least partly suppressed is characterized in that at least the drain zone of the transistor is provided with a lightly doped drain extension of the second conductivity type adjoining the channel. It is noted that this drain extension, which in principle counteracts the formation of hot electrons, is present in the logic portion only thanks to the invention, not in the memory.

A further embodiment of a method according to the invention is characterized in that the spacer is formed on the edges of the floating gate through thermal oxidation in an oxidizing environment comprising water vapor. This method of oxidizing not only has the advantage known per se of a higher oxidation rate than if water vapor were absent, but also the advantage that the oxidation continues to comparatively far below the floating gate electrode, at least considerably farther than an oxidation without water vapor, which is favourable for the formation of hot charge carriers. In addition, the oxidation below the floating gate advantageously reduces the capacitance between the floating gate and the drain zone (or source zone). When a voltage, for example 6 V, is applied to the drain zone during programming of an EPROM cell, while the voltage at the control gate is, for example 12 V, the drain zones of the non-selected cells of the same bit line will also be at 6 V. Owing to the capacitive coupling between the floating gate and the drain zone, the potential at the floating gate in the non-selected cells will rise. If the capacitance is too high, nonselected cells may become conducting, so that strong leakage currents will run in the bit line. The spacer oxidation described above forms a thicker oxide between the drain zone and the floating gate electrode, which causes a reduction in the parasitic capacitance.

Preferably, the oxidation of the edges of the floating gate is carried out at a temperature of at least 800° C. Good results are obtained at an oxidation temperature of approximately 900° C.

Preferably, the lateral edges of the floating gate only are oxidized during the oxidation treatment. A further embodiment of a method according to the invention is characterized in that the surfaces of the silicon layer which run parallel to the surface of the semiconductor body are masked by a layer which masks against oxidation and comprises nitride during the oxidation of the edges of the floating gate electrode. This anti-oxidation mask may be removed after the oxidation step and replaced with the inter-poly dielectric. In an alternative embodiment, however, the anti-oxidation mask may remain in place and form the inter-poly dielectric between the floating gate and the control gate.

A further embodiment of a method according to the invention is characterized in that the source and drain zones of the memory element are provided before the floating gate is provided with the spacer. The dopant atoms for the zones may be provided, for example, by means of ion implantation. Since the edges of the floating gate have not yet been covered with oxide, it is possible to provide the zone accurately aligned relative to the floating gate electrode.

An embodiment which leads to memories which are often referred to in the literature as "stacked EPROM", whereby a particularly small surface area per memory cell can be achieved and which is accordingly particularly suitable for very large numbers of cells, is characterized in that the silicon layer is formed by two sub-layers provided one on the other, an insulating layer being provided on the first sub-layer at the area of the memory element to be formed before the second sub-layer is provided, which insulating layer leaves the first sub-layer exposed at the area of the transistor to be formed, after which the second sub-layer is provided so that a single silicon layer is obtained at the area of the transistor to be formed and a composite layer of two mutually insulated sub-layers is obtained at the area of the memory element, the control gate electrode being subsequently formed from the upper sub-layer and the floating gate from the lower sub-layer. In this case the spacers are formed on the edges not only of the floating gate but also of the control gate.

An alternative embodiment, in which only two additional masks are required compared with a standard CMOS process, is characterized in that the silicon layer, called first sub-layer hereinafter, is covered at least at the area of the memory element with an insulating layer which leaves the first sub-layer exposed at the area of the transistor, and in that after the application of the spacer on the edges of the floating gate a second conductive layer is deposited which forms a layer separated from the floating gate at the area of the memory element, from which latter layer the control gate is formed, while said latter layer together with the first sub-layer forms a single conductive layer, from which the gate electrode of the transistor is formed, at the area of the transistor. The source and drain zones of the memory element may be formed after the spacer has been provided on the floating gate and before the control gate is provided.

A further embodiment of a method according to the invention is characterized in that the insulating layer between the floating gate and the control gate forms a layer comprising a nitride.

BRIEF DESCRIPTION TO THE DRAWINGS

The invention will be explained in more detail with reference to several embodiments and the accompanying diagrammatic drawing in, which:

FIG. 1a is a graph showing the relation between the threshold voltage in a non-volatile memory cell and the programming time for two different oxidation treatments;

FIG. 1b is a cross-section of such a non-volatile memory cell;

FIG. 2 is a plan view of a portion of an integrated circuit with an incorporated non-volatile memory according to the invention;

FIGS. 4a–13a show a number of steps in the method according to the invention for the manufacture of the device of FIG. 3; and FIGS. 14a –20b show a number of steps of an alternative embodiment of a method according to the invention.

DESCRIPTION OF THE PREFERRED EMBODIMENTS

Figure 3:
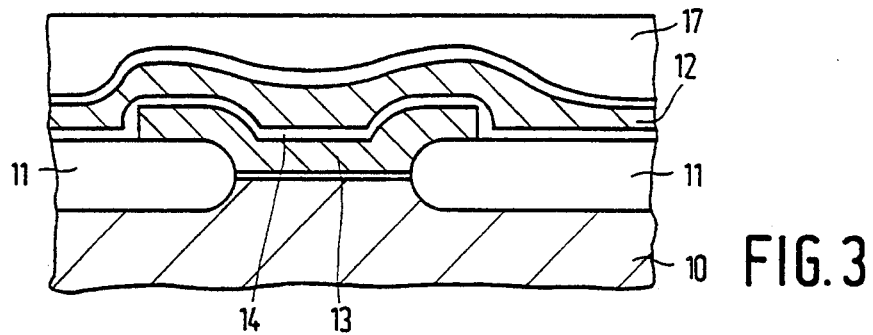
FIG. 3 is a cross-section of the device of FIG. 2 taken on the line III—III.

To clarify the effects on which the invention is based, FIG. 1a shows the influence of a certain process parameter, i.e. the oxidation temperature, on the programming speed. FIG. 1b is a cross-section of a non-volatile programmable memory cell of a construction which is known per se, with a p-type semiconductor body 1 in which an n-type source zone 2 and an n-type drain zone 3 are provided at a distance from one another. The source and drain zones are separated by a channel region of less than 1 μm length. Above the channel and separated therefrom by the interposed gate oxide 4 there is a floating gate 5 into which the information can be written in the form of an electric charge. A control gate 7 is provided above the floating gate 5, separated therefrom by a dielectric 6. The gates 5 and 7 are made, for example, of polycrystalline silicon, to be called poly hereinafter for short. The lateral edges of the gate configuration 5–7 are covered with an insulating layer 8 of silicon oxide obtained through thermal oxidation of the poly layers 5, 7. Programming takes place through injection of hot electrons at the floating gate 5. Given an initial state of the cell with a low threshold voltage, the transistor is driven into conduction in that a voltage of, for example, 12 V is applied to the control gate 7, whereby an inversion layer is formed below the gate oxide 4. A voltage of, for example, 6 V is applied to the drain zone 3. A current of electrons flows between the source zone 2, which is at 0 V, and the drain zone 3, which electrons are accelerated at the drain side of the channel and obtain sufficient energy thereby for crossing the potential barrier formed by the oxide layer 4 and reaching the floating gate 5. The floating gate 5 is negatively charged by this, so that the threshold voltage of the transistor rises. Research forming the basis of the present invention has shown that the threshold voltage change depends strongly on the spacer 8. In FIG. 1a, the threshold voltage $V_{th}$ is plotted on the vertical axis and the programming time t on the horizontal axis. Curves A and B show the threshold voltage gradient for a memory cell in which the spacer 8 was formed by a heat treatment in an oxidizing environment containing water vapor at a temperature of 800° C. and 900° C., respectively. All other circumstances under which the memory cells were manufactured were at least substantially identical. As is apparent from the graph, the spacer oxidation has a well-nigh dramatic influence on the programming characteristics of the memory cell. In particular, oxidation at 900° C. leads to much better results because programming in the embodiments investigated takes place more quickly than at 800° C. by a few orders of magnitude. It is not known what exactly is the cause of this difference. Possibly, the influence of the temperature on the diffusion pattern of the source and drain zones plays a pan, but other effects may be of greater or lesser importance as well, so that the invention must not be limited in this respect.

The most obvious process for the manufacture of an integrated circuit comprising an embedded EPROM is one in which the spacer oxidation described above, with which favorable results for the memory are obtained, is also carried out in the logic portion of the circuit in order to keep the number of process steps as small as possible. In processes involving channel lengths substantially greater than 1 μm, this apparently has not led to major problems. When the channel length in the logic portion of the circuit becomes smaller, however, hot-electron effects will play an increasingly important part in this portion. One of the detrimental effects is, for example, injection of electrons into the gate oxide whereby a gradual shifting of the threshold voltage occurs which in the end even renders operation of the circuit impossible. It is of great importance for these reasons to prevent the formation of hot electrons in the case of smaller channel lengths, and to optimize the memory only as to the generation of hot electrons with the smallest possible influence on the logic.

A further important parameter is the capacitance between the floating gate and the drain zone of the memory cell. During programming, a comparatively high voltage is applied to the drain zone, for example 6 V, while a voltage of, for example, 12 V is applied to the control gate 7. The non-selected cells which share a bit line with the selected cell also have 6 V at their drain zones. Owing to the capacitance between the floating gate and the drain zone, the potential of the floating gate in the non-selected cells will rise. When the said capacitance is sufficiently great, the non-selected cells may be driven into conduction, which can cause very considerable leakage currents in the bit line. The parasitic capacitance could be reduced by means of the spacer oxidation, whereby the oxide between the floating gate and the drain becomes thicker. Such a measure for optimizing the EPROM, however, is not necessarily desirable also in the logic.

A process is described below which basically corresponds to a standard CMOS process, which is accordingly optimized for the logic, and in which an optimization of the EPROM is obtained through the addition of only a few extra process steps which substantially do not influence the logic section. FIG. 2 for this purpose first shows a plan view of a portion of the embedded EPROM, while FIG. 3 and FIG. 4b are cross-sections of this portion taken on the lines III—III and IV—IV, respectively. The device comprises a silicon semiconductor body of a usual thickness and composition of which at least the portion shown in the drawing is mainly of the p-type. The active region of the memory matrix is defined at the surface by means of a pattern 11 of thick field oxide in the form of letters H lying on their sides. The field oxide is indicated with broken lines wherever it is situated below conductive layers, for example, poly. Conductor tracks 12 extend from left to right, forming the word lines of the memory. The word lines overlap the floating gate 13 above locations where the field oxide is interrupted and form the said control gates there, which are separated from the floating gate electrodes by the inter-poly dielectric 14. The portion of the body 10 not covered by field oxide and poly is re-doped to the n-type by means of a suitable dopant, so that strip-shaped n-type zones 15, which extend parallel to the word lines, and separate n-type zones 16 are formed in the body. The zones 15 form a common source for a word. Each zone 16 forms a common drain zone shared by two memory cells in the same column. The portions of the body situated below the floating gate electrodes 13 form the channel regions of the memory cells. The entire assembly is covered with a glass layer 17 in which a contact opening 18 is provided at the area of the drain zone 16. The zone 16 is connected through this opening to a usual bit line, not shown in the drawing, which extends in the form of a metal track in a direction transverse to the word lines and interconnects the drain zones of the memory cells in one column. The sides of the gate electrodes 12/13 are covered with spacer oxide 19 which will be discussed in more detail in the process description.

Figure 4A:
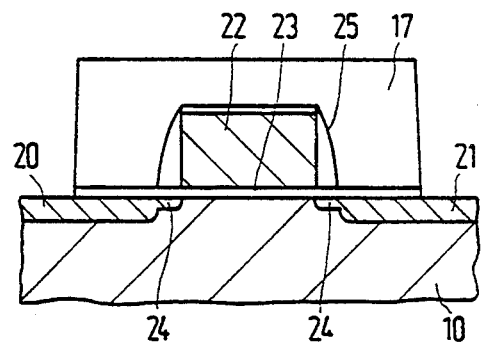
Figure 4B:
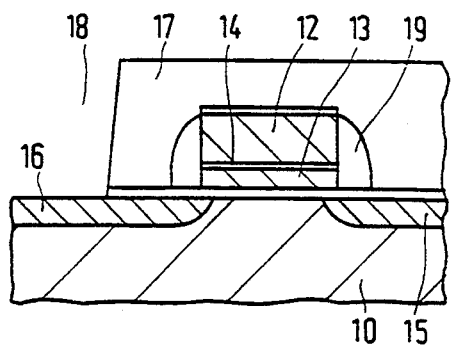
Figure 5A:
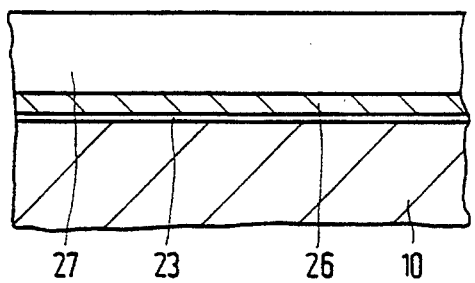
Figure 5B:
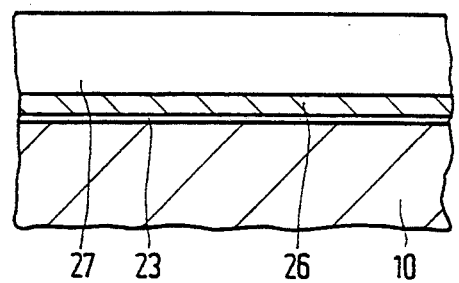

FIG. 4a is a cross-section of a transistor belonging to the logic. The transistor is of the n-channel type, as is the memory transistor, and comprises n-type source and drain zones 20 and 21 formed in the p-type region 10 and mutually separated by the interposed channel region above which the gate electrode 22 is situated, the latter being separated from the channel region by the gate dielectric 23. The drain zone 21 is provided with a so-called drain extension 24 which is formed by a high-ohmic, field-reducing n-type zone between the drain and the channel. As is generally known, this zone counteracts detrimental short-channel effects which would lead in particular to the generation of hot electrons. In the present example, the source zone 20 is also provided with such an extension 24 for reasons of process technology. The sides of the gate electrode 22 are provided with spacers 25.

A number of process steps are described with reference to FIGS. 5 to 13 in which, analogous to FIG. 4, the drawing in the left-hand column having the letter a relates to the logic transistor according to FIG. 4a and the drawing in the right-hand column having the letter b relates to the memory cell of FIG. 4b.

The process starts with a silicon substrate of a thickness and composition usual in CMOS processes which is provided at its surface with the conventional p and/or n pockets, so that p and n regions adjoining the surface are obtained with doping concentrations suitable for providing n-channel or p-channel transistors. The region referenced 10 in FIG. 4 may accordingly be formed by such a pocket. In alternative embodiments, the region 10 may also be formed by a surface region of the original semiconductor body. It is further assumed that the field oxide defining the active regions has already been provided in the stage shown in FIG. 5. The surface is provided with a thin oxide layer 23, which forms the gate dielectric of the transistors to be manufactured (FIG. 5), by means of thermal oxidation. A first poly layer 26 is deposited on this and doped with a suitable dopant, for example, As. The thickness of the poly layer 26 is, for example, 150 nm. In a next step, a photoresist mask 27 is provided, covering tracks in the memory portion which extend in the plane of the drawing and which have a width corresponding to the width of the floating gate 13. The term width here is understood to mean the dimension parallel to the surface and transverse to the current direction between source and drain in the channel. The photoresist layer 27 could be entirely removed in the logic portion (FIG. 5a), and accordingly also the poly material in a subsequent etching step. In the present embodiment, however, the poly is masked above the logic portion of the circuit, so that the poly layer 23 is not removed above the logic during etching of the poly in the memory portion, and the gate oxide in situ is not exposed to the etching treatment.

Figure 6A:
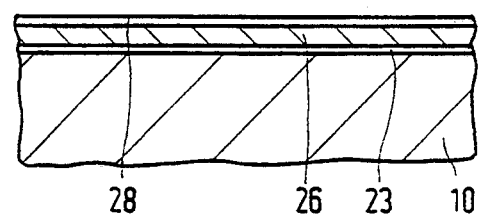
Figure 6B:
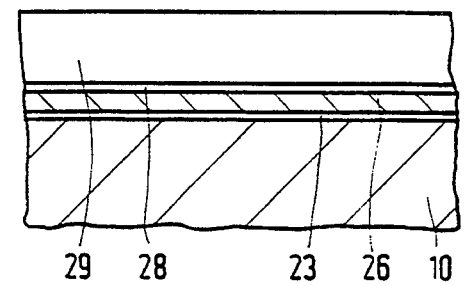

After the etching treatment, the mask 27 is removed, after which the exposed poly is covered with a dielectric layer 28 from which in a later stage the interpoly dielectric 14 is formed. The layer 28 may be made of various materials and may be formed in various manners which are known per se. Thus the layer 28 may be formed by oxidation of poly, in which case the layer 28 consists of silicon oxide. In the present example, the layer 28 is provided by deposition as a layer of oxynitride with a thickness of approximately 40 nm. Subsequently, a mask 29 is provided which covers the memory and leaves the logic exposed, as is shown in FIG. 6. The oxynitride above the logic is etched, preferably by an anisotropic etching treatment, so that the exposed sides above the field oxide remain covered by oxynitride. The mask 29 is thereupon removed. However, the oxynitride may alternatively be removed isotropically in a wet etching treatment.

Figure 7A:
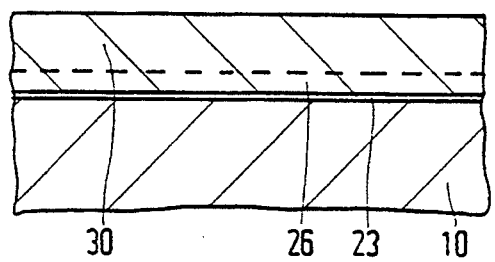
Figure 7B:
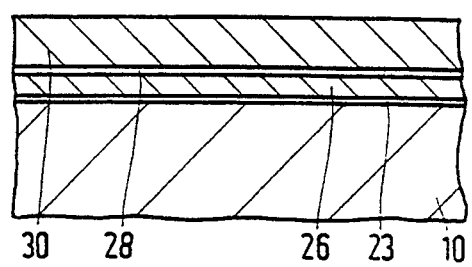

After this, a second poly layer 30 is provided by deposition from the gas phase to a thickness of, for example, 250 nm, see FIG. 7. The layer 30 forms a coherent poly layer together with the poly layer 26 at the area where the logic is provided and the insulating layer 28 was removed, as is shown in FIG. 7a. In this Figure, the interface between the poly layers 26 and 30 is shown in broken lines. In the memory portion, by contrast, the layer 30 forms a layer which is insulated from the poly layer 26 and from which the control gate 12 will be formed in a later stage of the process, see FIG. 7b After the deposition, the poly material of the layer 30 is also given an n-type doping, for example with P. The poly material is subsequently covered with a layer 31 which masks the poly against oxidation. In the present embodiment, a layer of oxynitride with a thickness of approximately 40 nm is also used for this, but obviously different materials which provide a mask against oxidation may alternatively be used, such as silicon nitride.

Figure 8A:
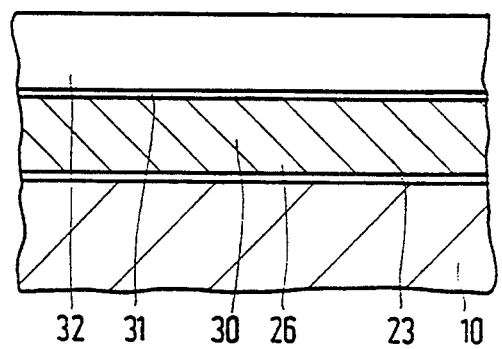
Figure 8B:
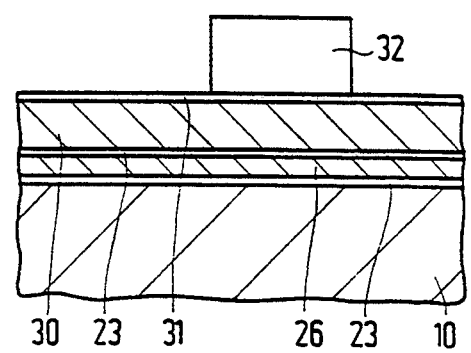
Figure 9A:
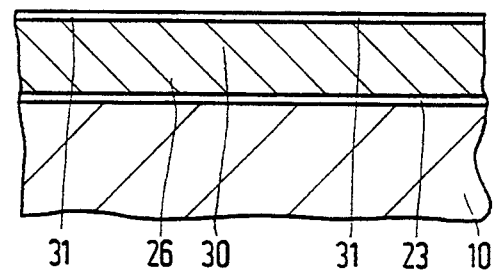
Figure 9B:
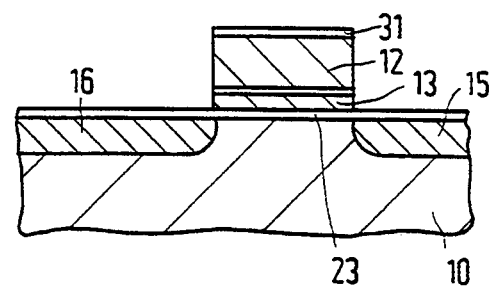

In a next step which is shown in FIG. 8, a mask 32 of, for example, photoresist is provided so as to cover the logic area entirely, and to cover that portion of the second poly layer in the memory section where the word lines and the control gate 12 are to be formed. With the layer 32 serving as a mask, the layer structure is treated, the oxynitride layer 31, the second poly layer 30, the inter-poly dielectric 28, and the first poly layer 26 being locally removed in that order. It is noted that the layer structure in the logic portion remains intact, so that the following treatment steps have no or at least substantially no influence on the logic portion.

The poly word lines 12 and the floating gate electrodes 13 have now been formed in the memory section. A heavy As implantation is now used for providing the source zone 16 and the drain zone 15 of the memory transistors, after which the mask 32 is removed, see FIG. 9b. If so desired, the mask 32 may obviously also be removed before the As implantation. As is evident from FIG. 9a, the source and drain zones are provided only in the memory section during this implantation step, whereas the logic portion remains entirely masked by the poly layers in this stage of the process. Subsequently, the device is subjected to an oxidation treatment for obtaining the oxide spacers 19 (FIG. 10b). This oxidation is carried out in such a manner that the favorable memory characteristics described above are obtained. Good results are obtained by means of an oxidation during approximately 7 minutes at a temperature of approximately 900° C. in an oxidizing environment containing water vapor. The thickness of the spacers 19, which cover not only the sides of the floating gate 13 but also those of the control gate 12 here, is approximately 30–80 nm. It is noted that the spacers 19 in the present example cover not all sides of the floating gate, but only the sides adjoining the source and drain zone, and that the edges of the floating gate situated below the word line are covered by the much thinner oxynitride. Oxide 33 may also be formed above the source zone and drain zone 15 and 16 during the oxidation. This oxide may extend to below the floating gate 13, which may contribute to the generation of hot charge carriers and which in any case does contribute to a reduction in the parasitic capacitance of the floating gate electrode.

Figure 10A:
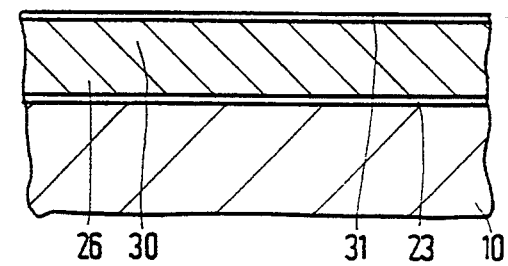
Figure 10B:
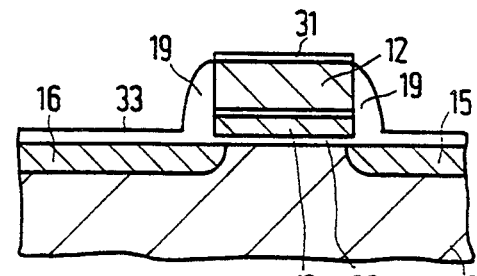

The upper side of the control gate 12 and of the combined poly layer 26, 30 in the logic portion, see FIG. 10a, is masked against oxidation by the oxynitride layer 31 during the oxidation step, so that no or at least substantially no oxide is formed here.

Figure 11A:
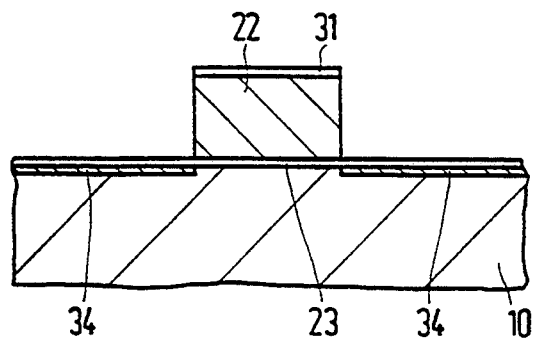
Figure 12A:
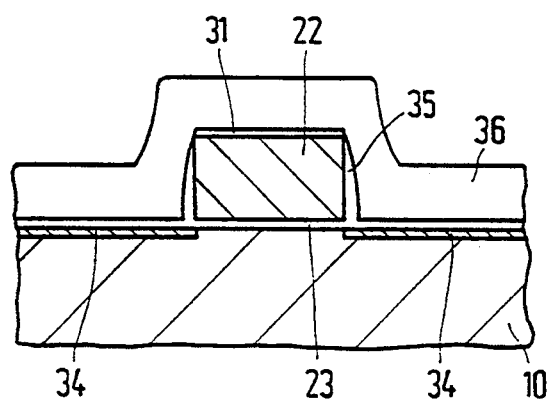
Figure 13A:
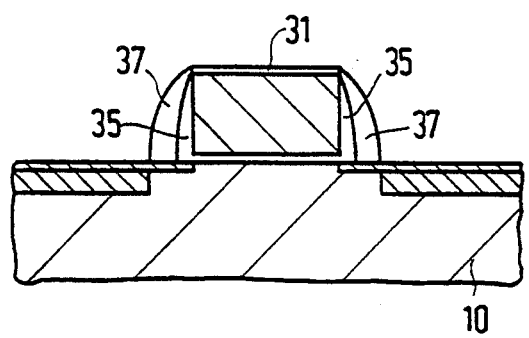

The extra steps carried out for optimizing the memory have thus been completed in principle and are followed by steps which are usual in a standard CMOS process. Since the memory in the stages shown in FIGS. 11-13 does not differ substantially from the state shown in FIG. 10b, the memory is no longer depicted in FIGS. 11-13. In a subsequent step, the gate electrode 22 is formed from the combined poly layer 26, 30, during which the memory portion is masked against the etching treatment used for this. Then a comparatively light As implantation 34 is carried out in the logic portion of the circuit, again with the necessary masking, so as to obtain the source and drain extensions 24. This stage is shown in FIG. 1 11a.

In a next stage (FIG. 12a), the gate electrode 22 of the transistor is provided with a spacer, for which purpose first a light oxidation is carried out by which the sides of the gate electrode 22 are covered with a thin oxide layer 35. The upper side of the gate electrode is not or substantially not oxidized during this owing to the presence of the oxidation-inhibiting oxynitride layer 31. Then an oxide layer 36 of, for example, approximately 250 nm thickness is provided by deposition and the spacers 37 are formed from this by anisotropic etching-back, see FIG. 13a. With the spacer 35, 37 acting as a mask, the source zone 20 and the drain zone 21 are now provided by implantation of As or P.

The process may be continued in a manner known per se for the manufacture of the p-channel transistors. Then the assembly may be covered with a glass layer 17 (FIG. 4), in which contact windows are provided in usual manner, after which a metal layer may be deposited from which a connection pattern is formed in the conventional manner.

The process described here has been changed compared with a usual CMOS process through the addition of only 3 extra masks in such a manner that optimum memory characteristics are obtained, while the logic portion is not or substantially not influenced and thus retains its favorable properties.

A modification of the process described above is shown in FIGS. 14-20, in which the drawings a in the left-hand column again show a logic transistor and the drawings b in the right-hand column a memory transistor. Corresponding parts have been given the same reference numerals as in the preceding example wherever possible.

Figure 14A:
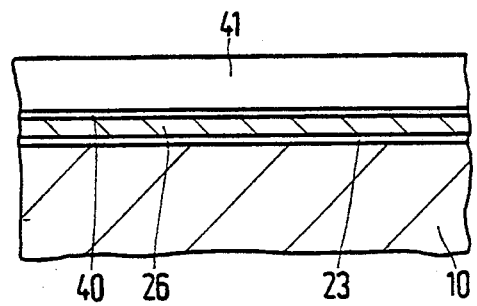
Figure 14B:
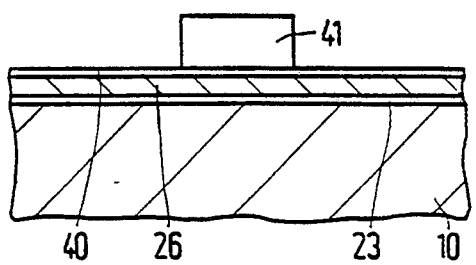
Figure 15A:
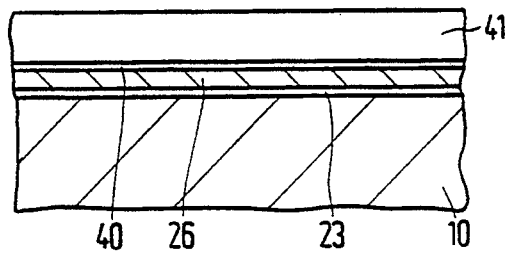
Figure 15B:
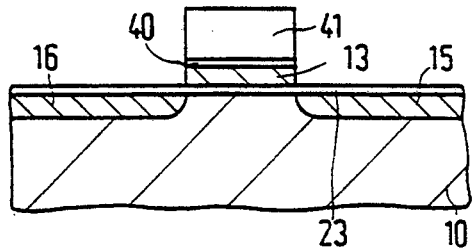
Figure 16A:
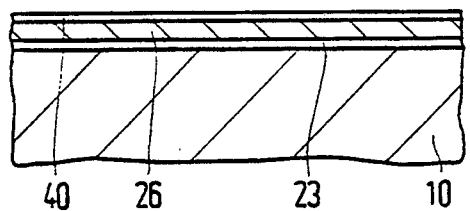
Figure 16B:
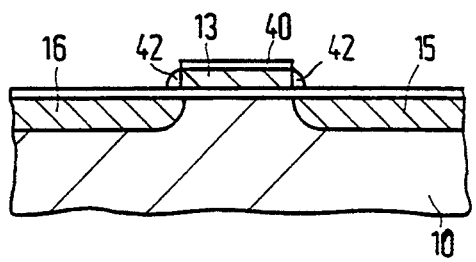

FIG. 14 shows a stage in which the body 10 is provided with the thin gate oxide layer 23 at the surface, which layer is coated with the first, n-type doped poly layer 26. An oxidation-masking layer 40, for example again an oxynitride layer, is provided thereon. Then the photoresist mask 41 is provided which defines the floating gate in the memory and which covers the logic entirely. Subsequently (FIG. 15), the floating gate 13 is formed by etching from the poly layer 26, after which the n-type zones 15 and 16, which form the source zone and the drain zone of the memory transistor, are provided by implantation of As ions and the photoresist mask 41 is removed, before or after the implantation. Then the oxide spacer 42 is formed by thermal oxidation. During this step, the upper side of the poly layer 26 in the logic and of the floating gate 13 are masked against oxidation by the oxynitride layer 40. The thickness of the spacer 42 is again, for example, 30–80 nm and is so chosen, on the analogy of the spacer 19 in the preceding embodiment, that favorable writing characteristics in the memory are obtained. Since the surface in the logic portion of the circuit is passivated by the layers 23, 26 and 40, this oxidation has no or at least substantially no influence in the logic. This stage of the process is depicted in FIG. 16.

Figure 17A:
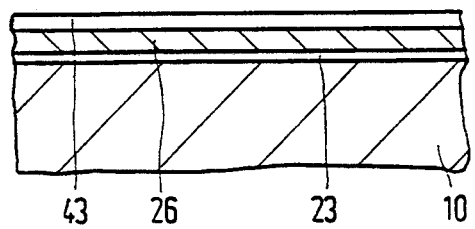
Figure 17B:
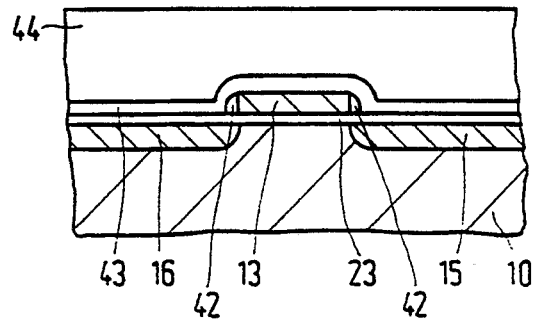

After this, a new protective layer of, for example, oxynitride 43 is provided over the entire assembly, preferably but not necessarily on the oxynitride layer 40 already present. The memory portion is then screened with a mask of, for example, photoresist 40 which leaves exposed at least the logic, as is shown in FIG. 17. After the removal of the oxynitride layer 43 over the logic area, the second poly layer 30 is provided and n-type doped. The second poly layer is insulated from the floating gate 13 by the oxynitride layer 43 in the memory portion, whereas in the logic to be formed the poly layers 26 and 30 again constitute a continuous poly layer (FIG. 18).

In a subsequent stage depicted in FIG. 19, the gate electrodes of the transistors in the logic and the control gates and/or word lines in the memory are defined simultaneously by means of a photoresist mask 45, after which the control gate 12 of the memory cells and the gate electrode 22 are formed by means of etching, preferably anisotropically, see FIG. 20. The process may then be continued in the same manner as described with reference to the preceding embodiment, see FIG. 11 ff.

In the modification described here with overlapping control gate, the decoupling between the logic and the spacer oxidation in the memory which renders it possible to optimize the memory without substantially influencing the logic is obtained by means of only two extra masks compared with a standard CMOS process.

Figure 21A:
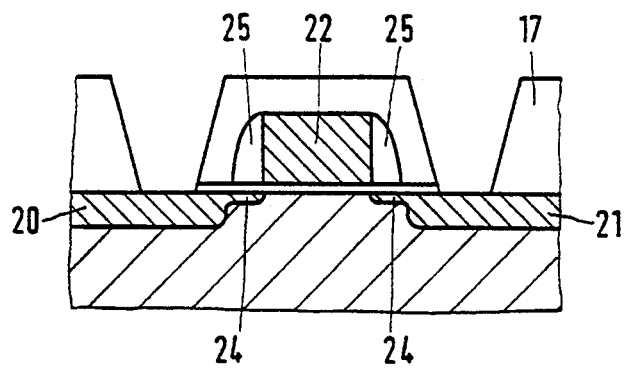
FIGS. 21a –21c show a further embodiment of a method according to the invention in cross-section.
Figure 21B:
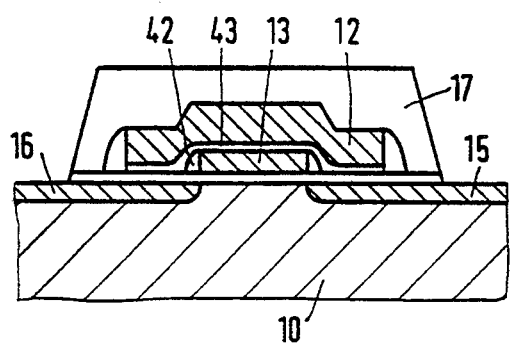
Figure 21C:
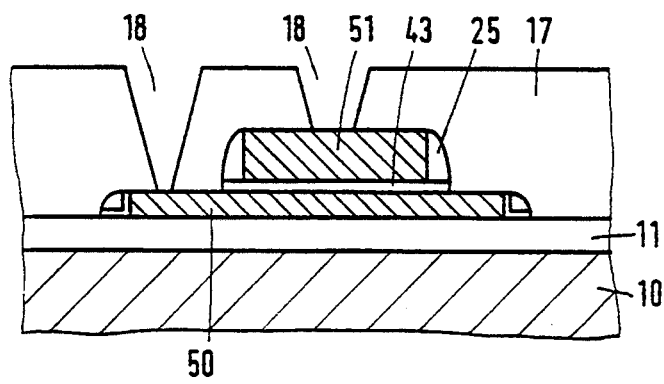

Besides non-volatile memory cells, other circuit elements may also be incorporated, such as capacitors. A special embodiment of this relates to an integrated circuit in which a system of so-called switched capacitors is provided adjacent the logic section so as to obtain, for example, frequency-selective filters. The incorporation of a programmable non-volatile memory as described above offers the user the additional possibility of programming. FIG. 21 shows in cross-section an embodiment of such an integrated circuit. FIG. 21a depicts a field effect transistor forming part of the logic section of the circuit which was manufactured by one of the methods described above. FIG. 21b shows an EPROM cell, corresponding to the cell of FIG. 20b, in which the control gate is provided over the floating gate 13 so as to overlap the latter. FIG. 21c is a cross-section of the capacitor which is manufactured simultaneously with the EPROM cell of FIG. 21b. The capacitor is provided on the thick field oxide 11 and comprises a lower capacitor plate 50 which is formed from the first poly layer simultaneously with the floating gate 13. A dielectric layer 43 is formed on the plate 50 simultaneously with the interpoly dielectric 43 of the EPROM cell. After removal of this layer at the area of the transistor, the second poly layer is deposited, from which the control gate 12 and the other capacitor plate 51 are defined simultaneously with the transistor gate 22. After the removal of those portions of the dielectric layer which are not covered by the plate 51 and the provision of spacers 25, a glass layer is provided. Contact windows 18 are provided in known manner known in this glass layer, through which windows contacts may be formed with elements such as the plates 50 and 51.

It will be apparent that the invention is not limited to the embodiments given here, but that many variations are possible to those skilled in the art within the scope of the invention. Thus, for example, the second poly layer from which the control gates and the word lines in the memory and the gate electrodes in the logic are made may be replaced by a different well-conducting material such as a metal or an alloy of silicon with a metal. The invention may further be advantageously used in various types of programmable non-volatile memories which are known per se, such as EPROMs, EPROMs and so-called Flash-EPROMs.

I claim:

1. A method of manufacturing an integrated circuit comprising a semiconductor body which is provided at a surface with a field effect transistor with insulated gate electrode and with a non-volatile memory element with a floating gate situated between a control electrode and a channel region which is situated in the semiconductor body and extends in the semiconductor body between a source and a drain zone, by which method a first and a second active region of a first conductivity type adjoining the surface are defined in the semiconductor body for the transistor and for the memory element, respectively, and the surface is coated with an insulating layer forming a gate dielectric at least at the area of the first and the second active region, on which insulating layer a silicon layer is provided from which the gate electrode of the transistor and at least the floating gate of the memory element are formed, characterized in that in a first series of process steps first the floating gate of the memory element is formed from the silicon layer by masked etching while the active region of the transistor remains covered by the silicon layer, after which the source and drain zones of the second conductivity type of the memory element are provided and the floating gate is provided with an oxide layer at least at its edges by means of an oxidation step, which oxide layer will be called spacer hereinafter, and in that in a subsequent series of steps the insulated gate electrode of the transistor is formed from the silicon layer above the other active region by masked etching, and source and drain zones of the second conductivity type of the transistor are provided in the semiconductor body by means of doping.

2. A method as claimed in claim 1, characterized in that the transistor is provided with a channel which is situated between the source zone and the drain zone and whose length, measured as the distance between the source zone and the drain zone, is at most approximately 1 $\mu$m.

3. A method as claimed in claim 1, characterized in that at least the drain zone of the transistor is provided with a lightly doped drain extension of the second conductivity type adjoining the channel.

4. A method as claimed in claim 1, characterized in that the spacer is formed on the edges of the floating gate through thermal oxidation in an oxidizing environment comprising water vapor.

5. A method as claimed in claim 4, characterized in that the oxidation is carried out at a temperature higher than 800° C., preferably higher than 850° C.

6. A method as claimed in claim 5, characterized in that the oxidation is carried out at a temperature of at least approximately 900° C.

7. A method as claimed in claim 1, characterized in that the surfaces of the silicon layer which run parallel to the surface of the semiconductor body are masked by a layer which masks against oxidation and comprises nitride during the oxidation of the edges of the floating gate electrode.

8. A method as claimed in claim 1, characterized in that the source and drain zones of the memory element are provided before the floating gate is provided with the spacer.

9. A method as claimed in claim 1, characterized in that the silicon layer is formed by two sub-layers provided one on the other, an insulating layer being provided on the first sub-layer at the area of the memory element to be formed before the second sub-layer is provided, which insulating layer leaves the first sub-layer exposed at the area of the transistor to be formed, after which the second sub-layer is provided so that a single silicon layer is obtained at the area of the transistor to be formed and a composite layer of two mutually insulated sub-layers is obtained at the area of the memory element, the control gate electrode being subsequently formed from the upper sub-layer and the floating gate from the lower sub-layer.

10. A method as claimed in claim 1, characterized in that the silicon layer, called first sub-layer hereinafter, is covered at least at the area of the memory element with an insulating layer which leaves the first sub-layer exposed at the area of the transistor, and in that after the application of the spacer on the edges of the floating gate a second conductive layer is deposited which forms a layer separated from the floating gate at the area of the memory element, from which latter layer the control gate is formed, while said latter layer together with the first sub-layer forms a single conductive layer, from which the gate electrode of the transistor is formed, at the area of the transistor.

11. A method as claimed in claim 9, characterized in that the insulating layer between the floating gate and the control gate forms a layer comprising a nitride.

12. A method as claimed in claim 1, characterized in that a capacitor is provided in the circuit, with a first plate and a second plate situated above the first, which plates are provided simultaneously with the floating gate and with the control gate of the memory element, respectively.

* * * * *